(12) United States Patent
Chan et al.

(10) Patent No.: US 8,587,012 B2
(45) Date of Patent: Nov. 19, 2013

(54) LED PACKAGE AND MOLD OF MANUFACTURING THE SAME

(71) Applicant: Advanced Optoelectronic Technology, Inc., Hsinchu Hsien (TW)

(72) Inventors: Shiun-Wei Chan, Hsinchu (TW); Chih-Hsun Ke, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/669,474

(22) Filed: Nov. 6, 2012

(65) Prior Publication Data
US 2013/0062650 A1    Mar. 14, 2013

Related U.S. Application Data

(62) Division of application No. 13/171,466, filed on Jun. 29, 2011, now Pat. No. 8,318,514.

(30) Foreign Application Priority Data

Oct. 6, 2010    (CN) ............................ 2010 1 0299294

(51) Int. Cl.
     *H01L 21/00*      (2006.01)
(52) U.S. Cl.
     USPC ............. 257/98; 257/431; 257/434; 257/672; 257/686; 257/787; 438/26; 438/15; 438/51; 438/64; 438/106

(58) Field of Classification Search
     USPC .......................... 257/431, 434, 672, 686, 787
     See application file for complete search history.

(56) References Cited

U.S. PATENT DOCUMENTS

| | | | |
|---|---|---|---|
| 6,642,618 B2 * | 11/2003 | Yagi et al. | 257/734 |
| 7,342,357 B2 | 3/2008 | Sakano et al. | |
| 2008/0149960 A1 | 6/2008 | Amo et al. | |
| 2009/0159913 A1 * | 6/2009 | Wang et al. | 257/98 |
| 2009/0309116 A1 * | 12/2009 | Kato et al. | 257/98 |
| 2009/0321758 A1 * | 12/2009 | Liu et al. | 257/98 |
| 2010/0148196 A1 * | 6/2010 | Kamada et al. | 257/98 |
| 2010/0237375 A1 * | 9/2010 | Yamazaki et al. | 257/98 |
| 2011/0095315 A1 * | 4/2011 | Park et al. | 257/98 |

\* cited by examiner

*Primary Examiner* — Julio J Maldonado
*Assistant Examiner* — Jaehwan Oh
(74) *Attorney, Agent, or Firm* — Altis & Wispro Law Group, Inc.

(57) ABSTRACT

The present disclosure provides a light emitting diode (LED) package, which includes a first substrate with electrodes disposed on a top thereof and a second substrate with an LED chip disposed on a top thereof. The LED chip is connected with the electrodes via wires. A first package layer is disposed on the top of the first substrate to cover the wires and electrodes. A fluorescent layer is disposed on the top of the second substrate to cover the LED chip. The present disclosure also provides a mold and a method of manufacturing the LED package.

12 Claims, 14 Drawing Sheets

LED PACKAGE AND MOLD OF MANUFACTURING THE SAME

CROSS-REFERENCE TO RELATED APPLICATION

The present application is a divisional application of U.S. patent application Ser. No. 13/171,466, filed on Jun. 29, 2011, which claims all benefits accruing under 35 U.S.C. §119 from CHINA 201010299294.4, filed on Oct. 6, 2010, the contents of which are hereby incorporated by reference.

BACKGROUND

1. Technical Field

The present disclosure relates to a light emitting diode (LED) package, and particularly, to a movable mold and method of manufacturing the LED package.

2. Description of Related Art

A molding process usually packages an LED. However, the molding process often damages the LED chip or the wires connecting to electrodes of the LED chip. In order to avoid the damage on the LED chip or the wires, fluorescent glue or encapsulation material has to be overflowingly provided on the LED chip before the fluorescent glue or encapsulation material is molded, so the thickness of the fluorescent glue or encapsulation material can be large enough to completely cover the wires. The overflow of the fluorescent glue or encapsulation material is wasteful, and the thickness of the fluorescent glue or encapsulation material seriously limits the thickness of the LED package.

Accordingly, it is desirable to provide an LED package, and a mold and a method of manufacturing the LED package which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the disclosure are now described in detail with reference to the accompanying drawings.

Figure 1:
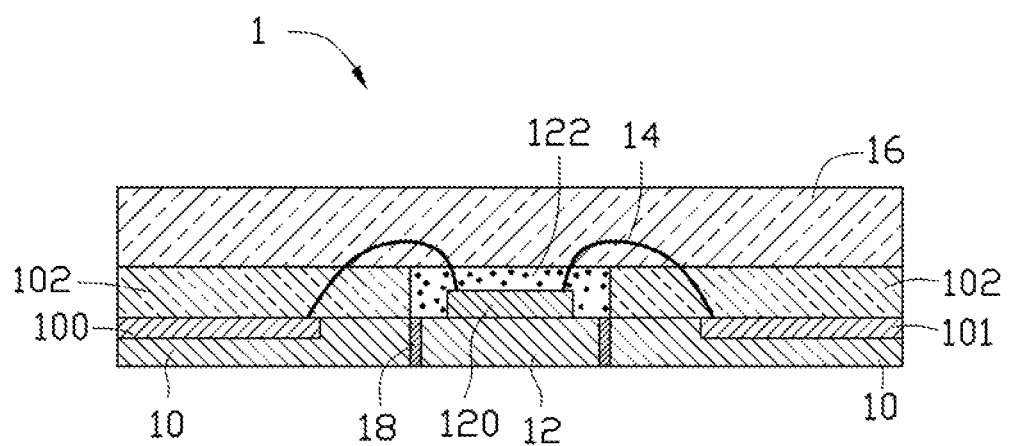
FIG. 1 is a cross-sectional view of an LED package according to a first embodiment of the present disclosure.

As shown in FIG. 1, an LED package 1 of the present disclosure includes a first substrate 10, a second substrate 12, an LED chip 120, a first encapsulation layer 102 and a fluorescent layer 122. The thickness of the first substrate 10 is identical to the thickness of the second substrate 12. The first substrate 10 includes a first electrode 100 and a second electrode 101 located at two opposite sides of the top of the first substrate 10. The LED chip 120 is located on the top surface of the second substrate 12. The second substrate 12 is located at a center of the first substrate 10. The tops of the first and second substrates 10, 12 are coplanar, while the bottoms thereof are also coplanar. The LED chip 120 is electrically connected to the first electrode 100 and the second electrode 101 via the wires 14. In this embodiment, the first substrate 10 defines a through hole in the center.

The first encapsulation layer 102 is located on the first substrate 10. The first encapsulation layer 102 covers the top of the first substrate 10, the first electrode 100, the second electrode 101 and portions of the wires 14 to enhance the connections between the wires 14 and the first and second electrodes 100, 101. Accordingly, reliability of the LED package 1 is increased. The first encapsulation layer 102 may be made of transparent material, such as poly(methyl methacrylate) (PMMA) resin, methacrylate resin, acrylic acid resin, polycarbonate or polyethylene resin.

The fluorescent layer 122 is located on the second substrate 12. The fluorescent layer 122 covers the top surface of the second substrate 12 and the LED chip 120. The fluorescent layer 122 converts portions of the light emitted from the LED chip 120 into a light having different wavelength. The lights having different wavelengths are mixed and emit from the LED package 1. The fluorescent layer 122 may include sulfides, aluminates, oxides, silicates or nitrides. Specifically speaking, the fluorescent layer 122 may include $Ca_2Al_{12}O_9$:Mn, $(Ca,Sr,Ba)Al_2O_4$:Eu, $Y_3Al_5O_{12}$:$Ce^{3+}$ (YAG), $Tb_3Al_5O_{12}$:$Ce^{3+}$ (TAG), $BaMgAl_{10}O_{17}$:$Eu^{2+}$ ($Mn^{2+}$), $Ca_2Si_5N_8$:$Eu^{2+}$, $(Ca,Sr,Ba)S$:$Eu^{2+}$, $(Mg,Ca,Sr,Ba)_2SiO_4$:$Eu^{2+}$, $(Mg,Ca,Sr,Ba)_3Si_2O_7$:$Eu^{2+}$, $Y_2O_2S$:$Eu^{3+}$, CdS, CdTe, $Ca_8Mg(SiO_4)_4C_{12}$:$Eu^{2+}$ or CdSe.

The LED package 1 further includes a second encapsulation layer 16 on the top surfaces of the fluorescent layer 122 and the first encapsulation layer 102 to protect the LED chip 120 and the wires 14. The second encapsulation layer 16 is made of transparent material, which may be identical to the first encapsulation layer 102. The thicknesses of the second encapsulation layer 16, the fluorescent layer 122 and the first encapsulation layer 102 can be adjusted during the manufacturing as required.

The LED package 1 further includes a metal film 18 in-between the first substrate 10 and the second substrate 12. The metal film 18 is located on the opposite sides of the second substrate 12, and contacts both surfaces of the second substrate 12 and surface of the first substrate 10. The interface between metal film 18 and the first substrate 10, and the interface between metal film 18 and the second substrate 12 are eutectic interfaces, which can enhance the connection between the first substrate 10 and the second substrate 12.

If the first substrate 10 includes two bases at two opposite sides of the second substrate 12, the LED package 1 includes two metal films 18 respectively located on the opposite sides of the second substrate 12 and contact the two bases of the first substrate 10.

Figure 2:
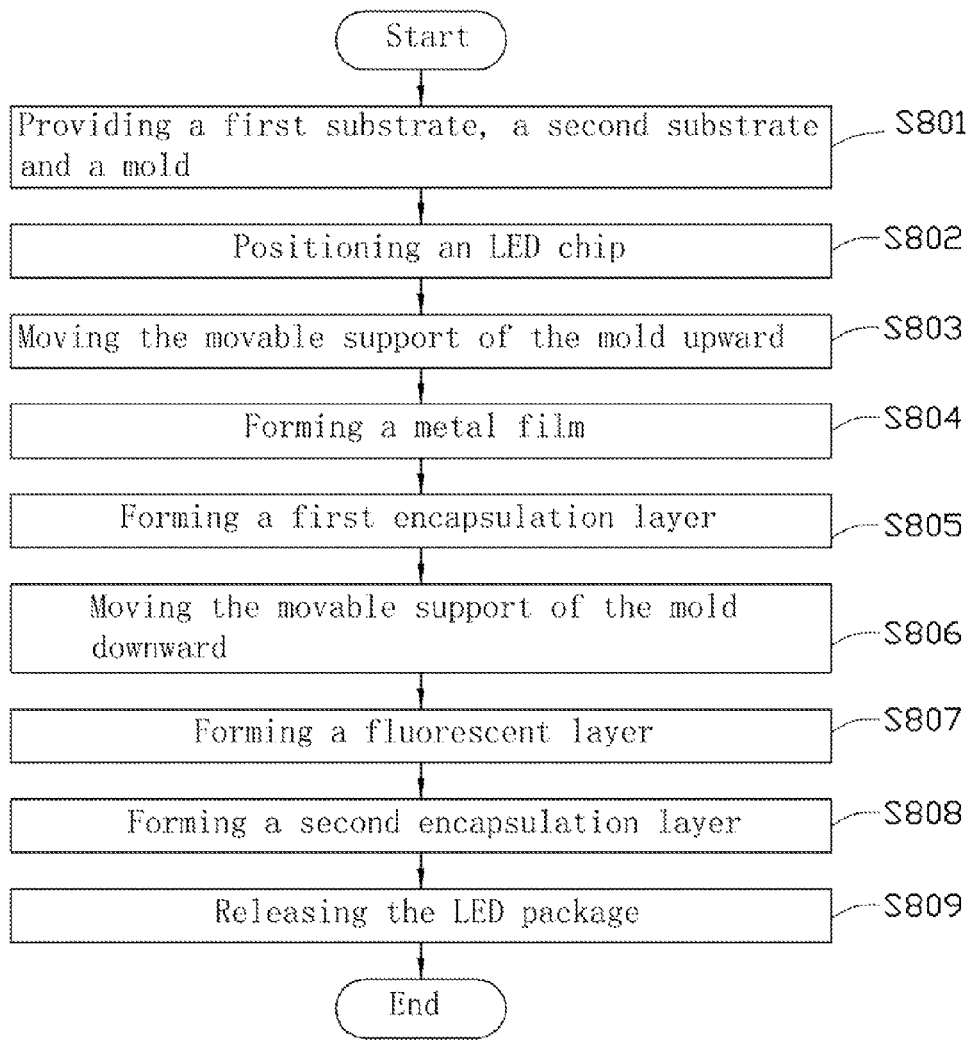
FIG. 2 is a flowchart of a method of manufacturing the LED package of FIG. 1.

As shown in FIG. 2, a method of manufacturing the LED package 1 includes the following steps.

Figure 3:
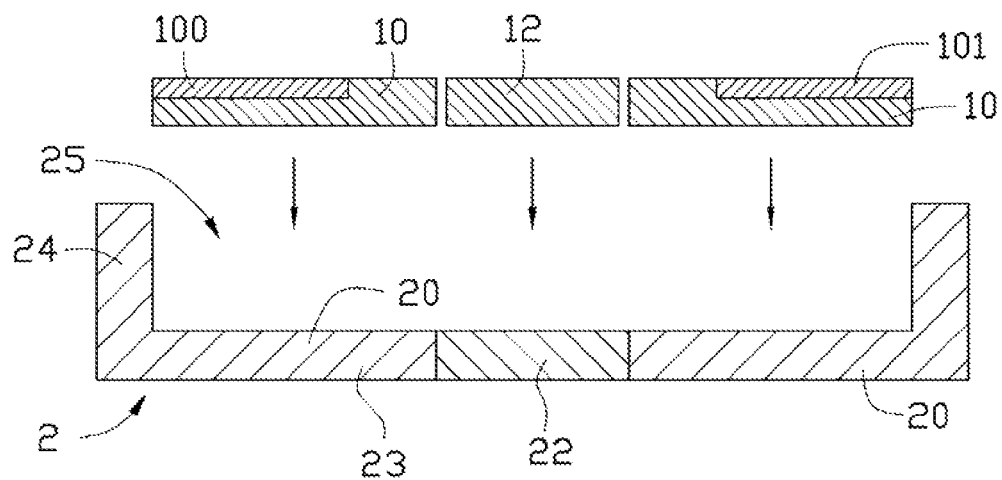
FIGS. 3-11 are cross-sectional views corresponding to steps S801-S809 of the method of FIG. 2, respectively.

Referring to both the step S801 and FIG. 3, the above-mentioned first substrate 10, second substrate 12 and a mold 2 are first provided. The mold 2 includes a fixed support 20 to support the first substrate 10, and a movable support 22 to support the second substrate 12. The fixed support 20 includes a bottom plate 23 and side walls 24 surrounding the bottom plate 23. In this embodiment, the bottom plate 23 defines a through hole in the center. The movable support 22 is inserted into the through hole, and slidably engages with the bottom plate 23. Accordingly, the movable support 22 and the bottom plate 23 together define a receiving recess 25, which opens upward. The movable support 22 is movable upward and downward relative to the fixed support 20 along a normal direction of the bottom plate 23.

In this embodiment, the movable support 22 is inserted into the through hole of the fixed support 20, and the receiving recess 25 defined by the movable support 22 and the fixed support 20 is rectangular. Numbers, relative position and shapes of the movable support 22, the fixed support 20 and the receiving recess 25 can be adjusted as required, and are not limited by this embodiment.

The first substrate 10 and the second substrate 12 are respectively positioned on the fixed support 20 and the movable support 22 of the mold 2. A solder material (not shown) may be coated between the first substrate 10 and the mold 2, and between the second substrate 12 and the mold 2 to enhance connections therebetween during the manufacturing process. The solder material has a low melting point, so it can be easily melted to release the first substrate 10 and the second substrate 12 from the mold 2 after the manufacturing process.

Figure 4:
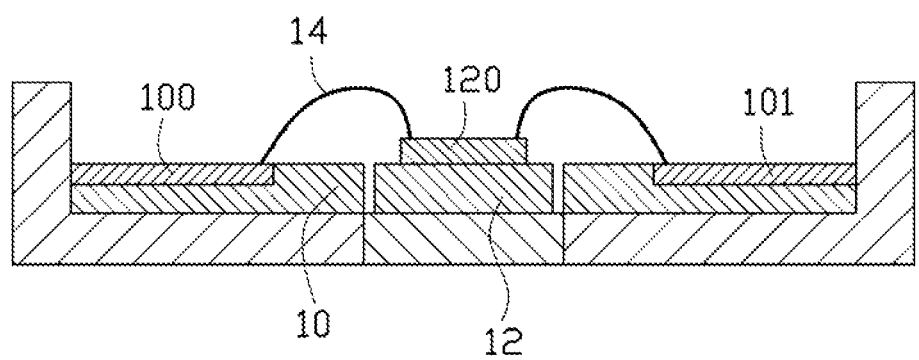

Referring to both the step S802 and FIG. 4, an LED chip 120 is positioned on the second substrate 12. A wire 14 electrically connects the LED chip 120 and the first electrode 100 of the first substrate 10, as well as connecting the LED chip 120 and the second electrode 101 of the first substrate 10.

Figure 5:
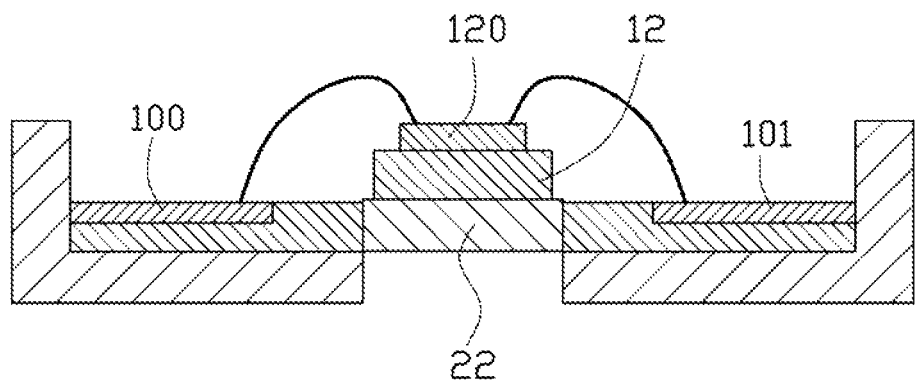

Referring to both the step S803 and FIG. 5, the movable support 22 of the mold 2 is moved upward, so the second substrate 12 is higher than the first electrode 100 and the second electrode 101 of the first substrate 10.

Figure 6:
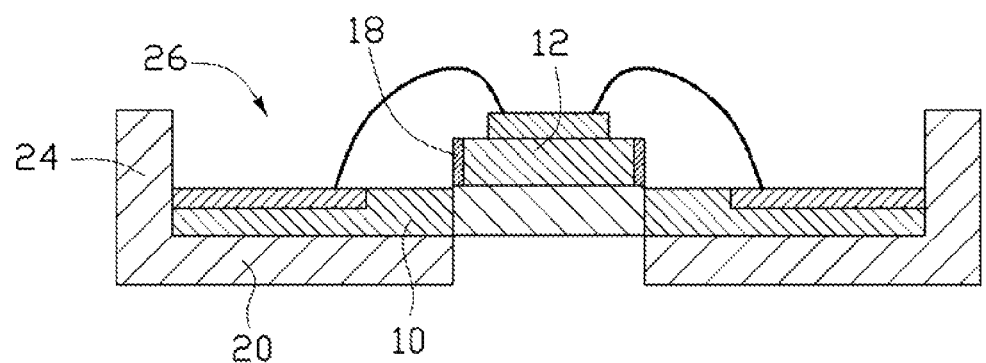

Referring to both the step S804 and FIG. 6, the metal film 18 is formed on side walls of the second substrate 12. The metal film 18 is located between the first substrate 10 and the second substrate 12 when the second substrate 12 is inserted in the through hole of the first substrate 10. The metal film 18 allows for easier separation between the second substrate 12 and the first encapsulation layer 102 in a following step. In addition, the interface between metal film 18 and the second substrate 12, and an interface between metal film 18 and the first substrate 10 will be eutectic interfaces, which can enhance the connection between the first substrate 10 and the second substrate 12.

Figure 7:
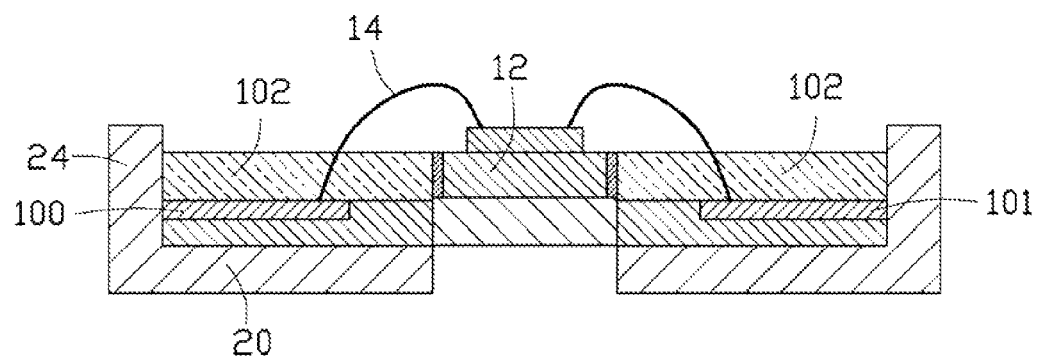

Referring to both the step S805 and FIG. 7, the first encapsulation layer 102 is formed by filling a first cavity 26 defined between the second substrate 12 and the side walls 24 of the fixed support 20. The first encapsulation layer 102 covers the first electrode 100, the second electrode 101, the first substrate 10, and portions of the wires 14. The first encapsulation layer 102 enhances the connections between the wires 14 and the first and second electrodes 100, 101. Since the first cavity 26 is automatically defined by the second substrate 12 and the side walls 24 of the fixed support 20, the first encapsulation layer 102 can be easily formed by a filling process, and a molding process is avoided. The filling amount of the encapsulation material or the shift distance of the movable support 22 can easily control the thickness of the first encapsulation layer 102.

Figure 8:
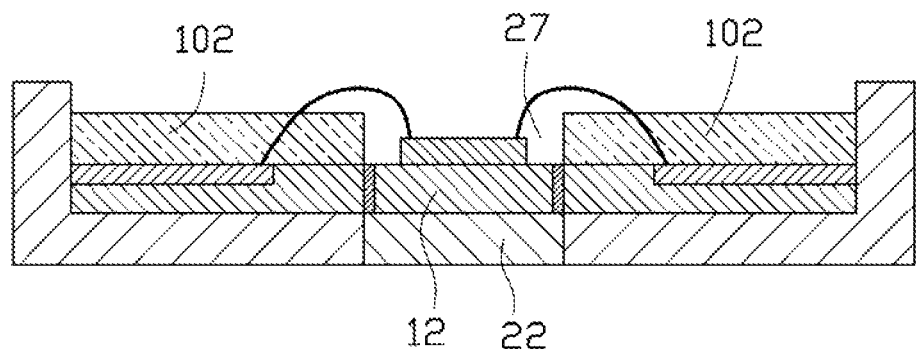

Referring to both the step S806 and FIG. 8, the movable support 22 is moved back into the through hole of the fixed support 20. The top surface of the second substrate 12 is now lower than the top surface of the first encapsulation layer 102, so the first encapsulation layer 102 and the second substrate 12 define a second cavity 27.

Figure 9:
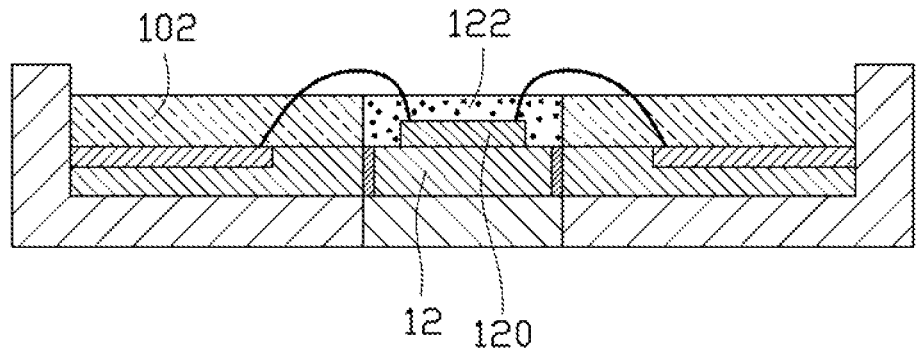

Referring to both the step S807 and FIG. 9, the fluorescent layer 122 is formed by filling the second cavity 27. The fluorescent layer 122 covers the LED chip 120 and the top surface of the second substrate 12. Accordingly, a filling process can easily form the fluorescent layer 122, and a molding process is avoided.

The thickness of the first encapsulation layer 102 can be easily controlled by the filling amount of the encapsulation material or the shift distance of the movable support 22. The thickness of the fluorescent layer 122 is identical with the thickness of the first encapsulation layer 102, and the top surface of the fluorescent layer 122 is at the same level as the first encapsulation layer 102.

Figure 10:
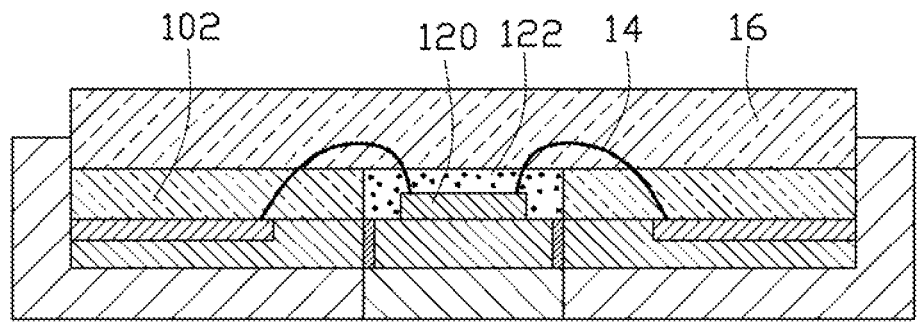

Referring to both the step S808 and FIG. 10, the second encapsulation layer 16 is formed on the fluorescent layer 122 and the first encapsulation layer 102 to protect the LED chip 120 and the wires 14. The thickness of the second encapsulation layer 16 can be easily controlled.

Figure 11:
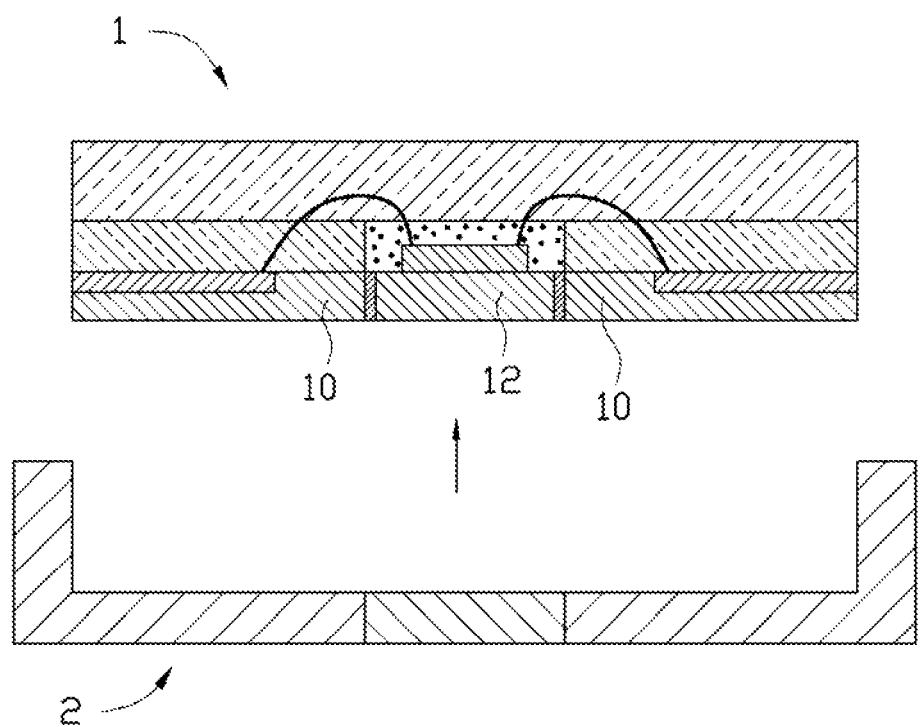

Referring to both the step S809 and FIG. 11, the LED package 1 is released from the mold 2. In this embodiment, a solder material is coated between the first substrate 10 and the mold 2, and between the second substrate 12 and the mold 2, so a heating process separates the LED package 1 from the mold 2. Once the solder material is melted, the first substrate 10 and the second substrate 12 are released.

Figure 12:
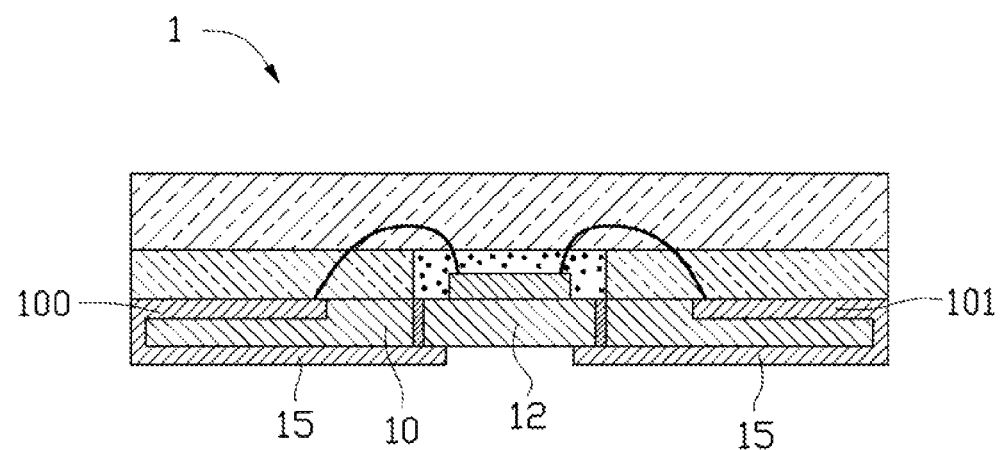
FIG. 12 is a cross-sectional view of an LED package according to a second embodiment of the present disclosure.

As shown in FIG. 12, the LED package 1 may optionally include two contact electrodes 15 at the bottom thereof. One of the contact electrodes 15 is electrically connected to the first electrode 100, and another contact electrode 15 is electrically connected to the second electrode 101. Each contact electrode 15 stretches from sidewalks of the first substrate 10 to the bottom surface of the first substrate 10, and reaches the second substrate 12. Accordingly, the LED package 1 is a surface mounted device (SMD). In addition, the contact electrodes 15 can also enhance the connection between the first substrate 10 and the second substrate 12.

Figure 13:
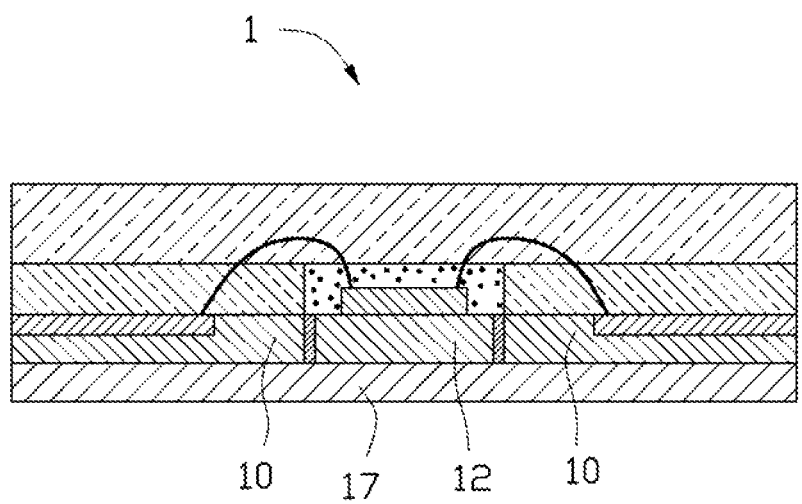
FIG. 13 is a cross-sectional view of an LED package according to a third embodiment of the present disclosure.

As shown in FIG. 13, if the first substrate 10 and the second substrate 12 are made of ceramics, a sintering process can be optionally performed to form another ceramics substrate 17 to support the first substrate 10 and the second substrate 12. The ceramics substrate 17 can fix the first substrate 10 and the second substrate 12.

Figure 14:
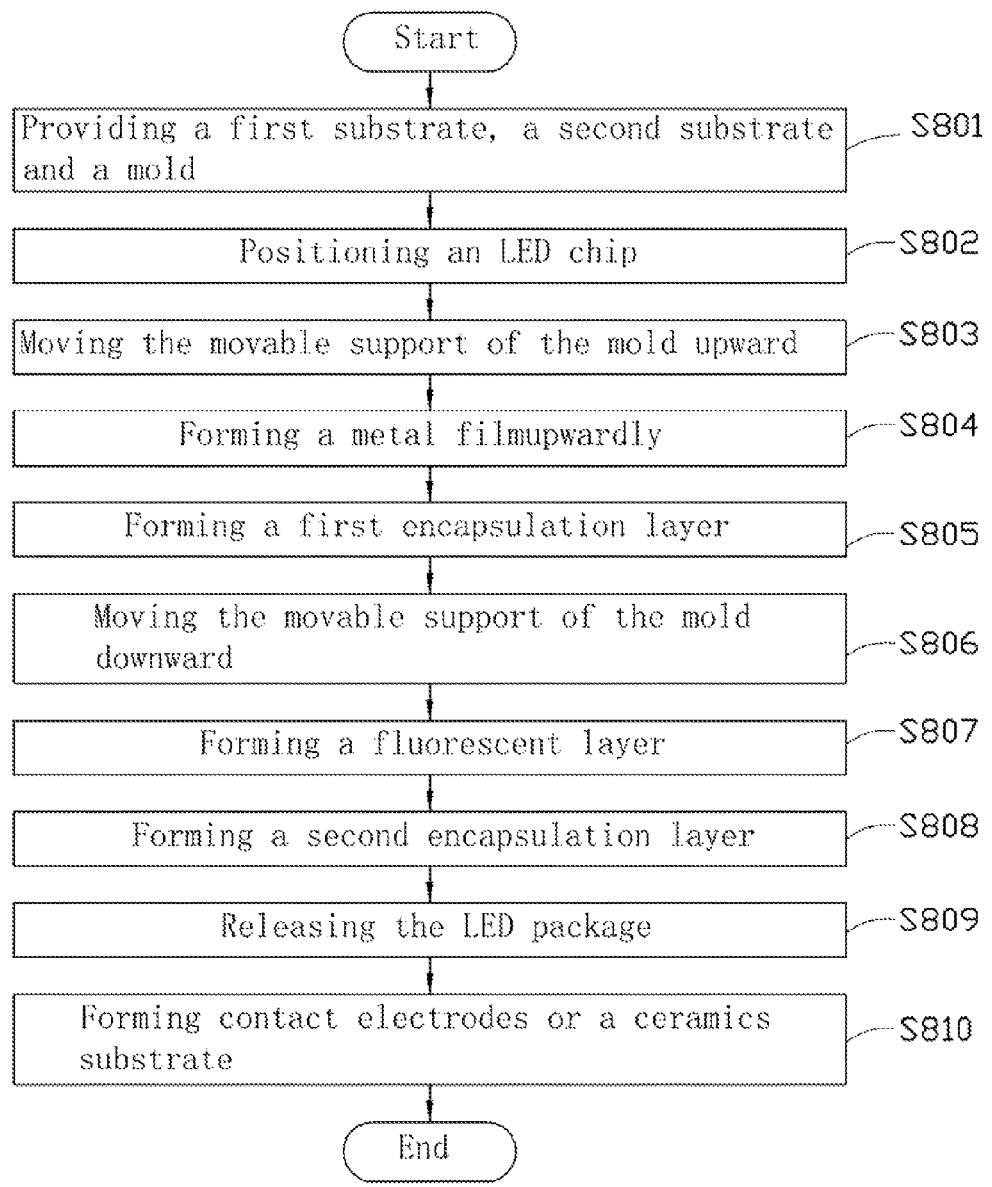
FIG. 14 is a flowchart of a method of manufacturing the LED package according to the second or third embodiment.

As shown in the step S810 of FIG. 14, the contact electrodes 15 or the ceramics substrate 17 is formed after the LED package 1 is released from the mold 2.

In summary, the LED package 1 is manufactured with the movable mold 2. The second substrate 12 is moved upward and downward relative to the first substrate 10 with the movable support 22, to form the first cavity 26 and the second cavity 27 during the manufacturing process. Thus, the first encapsulation layer 102 is only covering the first substrate 10, and the fluorescent layer 122 is only covering the second substrate 12 and thus, can be formed by a filling process. Since the molding process is avoided in the manufacturing process, the LED chip 120 and the wires 14 are effectively protected. Furthermore, the thicknesses of the first encapsulation layer 102 and the fluorescent layer 122 can be easily controlled, and cost of the encapsulation material and the fluorescent material is reduced.

It is to be understood, however, that even though numerous characteristics and advantages of the present embodiments have been set forth in the foregoing description, together with details of the structures and functions of the embodiments, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. An LED package, comprising:

a first substrate, the first substrate comprising two electrodes at a top portion of the first substrate and a through hole defined in a center of the first substrate;

a second substrate inserted in the through hole, wherein a top surface of the first substrate and a top surface of the second substrate are coplanar;

a metal film formed on side walls of the second substrate and located between the first substrate and the second substrate, wherein the metal film simultaneously contacts the first substrate and the second substrate;

an LED chip located on the second substrate;

two wires electrically connecting the LED chip and the two electrodes;

a first encapsulation layer located on the first substrate, the first encapsulation layer covering the wires and the electrodes; and a fluorescent layer located on the LED chip, the fluorescent layer covering the second substrate and surrounded by the first encapsulation layer.

2. The LED package of claim 1, wherein an interface between metal film and the first substrate, and an interface between metal film and the second substrate are eutectic interfaces.

3. The LED package of claim 1, wherein the first substrate is as thick as the second substrate.

4. The LED package of claim 1, further comprising a second encapsulation layer covers the fluorescent layer and the first encapsulation layer.

5. The LED package of claim 4, wherein the first encapsulation layer and the second encapsulation layer are transparent.

6. The LED package of claim 1, further comprising two contact electrodes located at a bottom of the first substrate.

7. The LED package of claim 6, wherein the two contact electrodes are respectively connected to the two electrodes.

8. The LED package of claim 7, wherein each of the two contact electrodes stretches from a sidewall of the first substrate to the bottom surface of the first substrate, and reaches the second substrate.

9. The LED package of claim 1, wherein the first substrate and the second substrate are made of ceramics, and a third ceramics substrate is formed to support the first substrate and the second substrate.

10. A mold of manufacturing an LED package comprising a first substrate, two electrodes located at a top portion of the first electrode, a second substrate, an LED chip located on the second substrate, two wires electrically connecting the LED chip and the two electrodes, a first encapsulation layer located on the first substrate and covering the wires and the electrodes, and a fluorescent layer located on the LED chip, the fluorescent layer covering the second substrate, the mold comprising:

a fixed support to support the first substrate; and a movable support to support the second substrate;

wherein the movable support and the fixed support together define a receiving recess, which opens upward, the movable support is movable upward and downward relative to the fixed support to be received in a through hole defined by the fixed support;

wherein when the movable support is movable upward, a first cavity is defined between the second substrate and the fixed support for forming the first encapsulation layer; and wherein when the movable support is movable back, a second cavity is defined between the first encapsulation layer and the second substrate for forming the fluorescent layer.

11. The mold of claim 10, wherein the fixed support comprises a bottom plate and a plurality of side walls surrounding the bottom plate.

12. The mold of claim 11, wherein the through hole of the fixed support is defined in the bottom plate, and the movable support is movable upward and downward along a normal direction of the bottom plate.

* * * * *